United States Patent [19]

Ito et al.

[11] Patent Number: 5,114,866
[45] Date of Patent: May 19, 1992

[54] FABRICATING AN AVALANCHE PHOTO DIODE HAVING A STEP-LIKE DISTRIBUTION

[75] Inventors: Kazuhiro Ito, Tokyo; Hiroshi Matsuda, Kanagawa; Yuuji Nagano, Urawa, all of Japan

[73] Assignees: Hitachi, Ltd.; Hitachi VLSI Engineering Corporation, both of Tokyo, Japan

[21] Appl. No.: 690,352

[22] Filed: Apr. 24, 1991

Related U.S. Application Data

[63] Continuation-in-part of Ser. No. 474,336, Feb. 2, 1990.

[30] Foreign Application Priority Data

Feb. 10, 1989 [JP] Japan ................................. 1-29802
Apr. 27, 1990 [JP] Japan ................................. 2-110062

[51] Int. Cl.$^5$ ............................................. H01L 31/18
[52] U.S. Cl. ............................................. 437/3; 437/5; 437/149; 437/167; 437/958
[58] Field of Search ................ 437/3, 5, 148, 149, 437/150, 167, 956, 958, 987; 148/DIG. 39, DIG. 145, DIG. 157

[56] References Cited

U.S. PATENT DOCUMENTS 4,876,209 10/1989 Forrest ............................. 437/3
4,992,386 2/1991 Furuyama et al. ................ 437/149

FOREIGN PATENT DOCUMENTS

| 0136225 | 6/1986 | Japan | 437/167 |
| 0220481 | 9/1986 | Japan | 437/5 |
| 0051674 | 2/1989 | Japan | 437/3 |
| 0159775 | 6/1990 | Japan | 437/3 |

OTHER PUBLICATIONS

Taguchi et al., "Planar Type InGaAs PLEG-APD for Optical Communication", Shingakugichou, OQE8-6-183, pp. 71-78.

Primary Examiner—Brian E. Hearn
Assistant Examiner—C. Chaudhari
Attorney, Agent, or Firm—Antonelli, Terry, Stout & Kraus

[57] ABSTRACT

Disclosed is a preferable method for producing an avalanche photo diode in which an impurity-doped region having a relatively high concentration and a step-like distribution has a step portion in another impurity-doped region having a relatively low concentration and a gradational distribution so that the circumferential portion of the high concentration region is made shallow in comparison with the central portion of the same, the step portion having a shape so that the radius of curvature thereof varies continuously.

9 Claims, 5 Drawing Sheets

FABRICATING AN AVALANCHE PHOTO DIODE HAVING A STEP-LIKE DISTRIBUTION

This is a Continuation-In-Part Application of our copending U.S. patent application, allowed Sep. 27, 1991 Ser. No. 07/474,336 filed Feb. 2, 1990, the disclosure of which is hereby incorporated by reference.

BACKGROUND OF THE INVENTION

The present invention relates to photo detection devices, more particularly to avalanche photo diodes and a producing method therefor.

There are related arts as follows.

In Shingakugihou, OQE86- 183, pp. 71-78, discussed is a device including a ring-like guardring junction doped with an impurity and having a comparatively low concentration distribution and a main junction composed of comparatively high concentration impurity.

In JP-A-Sho-61-136225, disclosed is a device having a ring-like guardring junction in which the impurity concentration is comparatively low in the vicinity of a pn-junction, while high in the outer side surface.

In JP-A-Sho-61-51674, disclosed is a device in which a guardring junction is provied in the circumferential portion of a main junction having a depth which varies depending on places.

In JP-A-Hei-2-159775, disclosed is a device in which a guardring junction is provided in the circumference of a main junction having a depth which is deep at the central portion and shallow in the circumferential portion.

SUMMARY OF THE INVENTION

In the above conventional techniques, since the shape and producing process of an impurity-doped region having a comparatively high concentration and a step-like distribution are not considered, there have been problems in the prevention of edge breakdown, the prevention of photo sensitivity outside a light absorbing window, the uniformity of the photo sensitivity a light absorbing window, the gain, the yield of products, and so on.

That is, in the above Singakugihou, as shown in FIG. 8, a high concentration impurity-doped region 91 for forming a photodetection p+n-junction (main junction) 90 is formed so as to have an even depth also in a guardring portion 92. That is, the distance between the high concentration impurity-doped region 91 in the guardring portion 92 and a guardring junction 92' of the guardring portion 92 is so small that it is inevitably necessary to prevent electric field concentration from occurring at an edge 91' of the high concentration region in the guardring portion 92 to cause edge breakdown, to thereby make it impossible to obtain preferable gain.

In the technique disclosed in the above JP-A-Sho-61-136225, as shown in FIG. 9, the concentration in the outer side surface 103 of a guardring forming impurity-doped region 102 is high. The high concentration portion 103 and a high concentration impurity-doped region 101 for forming a photo-detection p+n-junction (main junction) have a superimposing portion 104. Regarding that the main junction forming the high concentration impurity-doped region 101 and the guardring high concentration portion 103 are integrated into one, therefore, the distance between a guardring junction 102' and the high concentration portion 103 is so large that the electric field concentration to an edge portion of the high concentration portion 103 is reduced in comparison with that in the technique described in the above Singakugihou. However, since the two regions 103 and 101 are formed of impurities different from each other, the shape of the two regions do not have gradational continuity. Accordingly, generally, there has been a defect in that an edge 101' of the main junction forming the high concentration impurity-doped region 101 is left as it has a small radius of curvature so that it is inevitably necessary to prevent electric field concentration.

In the technique disclosed in the above JP-A-Sho-61-51674, the central portion of a main junction is made close to a region which is high in carrier concentration to thereby prevent occurrence of edge breakdown and dark current. However, the relation between the high concentration impurity-doped region in the guardring portion and the guardring junction is the same as the relation in the case of FIG. 8 and therefore there is a problem similar to that in the case of the Singakugihou.

In the technique disclosed in the above JP-A-Hei-2-159775, in the time of formation of the main junction having a depth which is deep at the central portion and shallow in the circumferential portion, the depth of the junction is made changed by doping an impurity from above a spacer layer. In this method, however, the depth of the junction is determined depending on the thickness of the spacer and the depth cannot be changed in a way of the process. However, the optimum value of the depth of the junction varies with individual semiconductor substrates, and there is therefore a problem of poor yield in this method. Further, in the case where the quality of material of the spacer is different from the crystal base material of the crystal substrate (hetero crystal), it is difficult to control the depth of the junction because the impurity diffusion rate is different between the spacer and the substrate. Further, there is a case in which lateral abnormal diffusion occurs in the hetero interface at the time of impurity doping, resulting in a problem in yield.

In order to attain the above object, according to the present invention, in a second impurity-doped region having a relatively low concentration and a gradational distribution, a first impurity-doped region having a relatively high concentration and a step-like distribution has a circumferential portion and a central portion which exist in horizontal planes different from each other to thereby form a step portion. At this time, the plane in which the central portion of the first region exists is closer to the outer side surface of the device than the plane in which the circumferential portion of the same exists. The step portion is shaped so as to vary the radius curvature thereof continuously. In the producing process, the first impurity-doped region is formed by performing at least two times a step of forming an impurity-doped region having a relatively high concentration and a step-like distribution. Further, after the formation of the impurity-doped region, heating is made to perform emphasized diffusion to move the impurity toward a deeper portion to thereby form the step portion. Alternatively, the crystal is worked so as to have an uneven surface and an impurity is doped into the crystal through the uneven surface to thereby form the step portion.

In a preferable embodiment of the present invention, after formation of a main junction region having a step portion, a film of SiNx or the like is formed on a surface of the main junction region and heated to thereby remove a defect in the step portion or in the pn-junction by the effect of emphasized diffusion. This technique was disclosed, by a part of the inventors of this application, in the abovementioned application Ser. No. 07/474336.

According to the present invention, the whole of the high concentration region can be formed with the same kind impurity.

That is, as shown in FIG. 1, in a guardring forming impurity-doped region 24 having a low concentration and a gradational distribution, a main-junction forming impurity-doped region 25 having a high concentration and a step-like distribution is formed so as to have a gently continuous step portion (shown by a region 26). Thus, a curved edge portion 26' having a small radius of curvature is far from a guardring junction 24' and a gently continuous step portion closer to the guardring junction 24' has a large radius of curvature, so that there is an advantage that breakdown due to electric field concentration can be effectively prevented.

According to the present invention, since the edge portion having a small radius of curvature of an impurity-doped region having a relatively high concentration and a step-like distribution is located in a position far from a guardring junction, it is possible to form an impurity-doped region having a relatively low concentration and a gradational distribution with a large thickness in the vicinity of the guardring portion. Accordingly, upon application of a reverse voltage, it is possible to make the width of a depletion layer in the vicinity of the edge portion larger than that in the conventional case so that the breakdown voltage at the edge portion becomes high to make the prevention of edge breakdown easy. As a result, it is possible to make the gain high, to eliminate unevenness in photo sensitivity, and to reduce the photo sensitivity outside a light absorbing window. Further, since the high concentration region is shallow, a sufficient breakdown voltage can be obtained even if the pn-junction of the impurity-doped region having a low concentration and a gradational distribution is formed in a position shallower than that in the conventional case. Accordingly, there is an effect that the electric field intensity applied to the light absorbing portion having a narrow energy gap can be made low, so that it is possible to reduce the dark current so as to make the photo-detection device to operate as a low-noise high-speed device. Further, in this structure, since edge breakdown can be prevented easily, the main junction can be formed in a position close to an electric field buffer layer having a high carrier concentration or in the electric field buffer layer per se, resulting in an advantage that the high speed operation becomes more easy.

Further, according to the main-junction region producing method of the present invention, it is possible to change the depth of the junction portion in the way of process so that high yield can be obtained. Further, since no spacer different from a base material of the crystal substrate is used, the control on the depth of the junction portion can be performed easily and no abnormal diffusion in the horizontal direction is caused in the hetero interface at the time of impurity doping.

DESCRIPTION OF THE PREFERRED EMBODIMENTS

Figure 1:
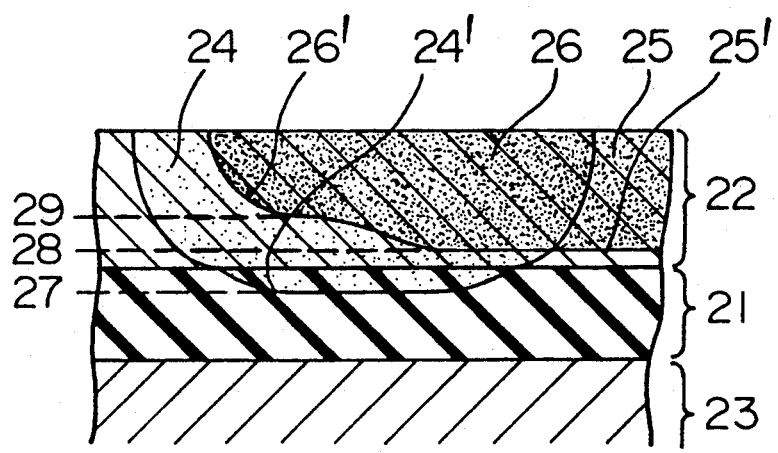
FIGS. 1 and 10 are vertical sections each showing the shape of the impurity-doped region in the photo-detection device according to the present invention.

Referring to the drawings, the present invention will be described below with respect to embodiment thereof.

EXAMPLE 1

Figure 2A:
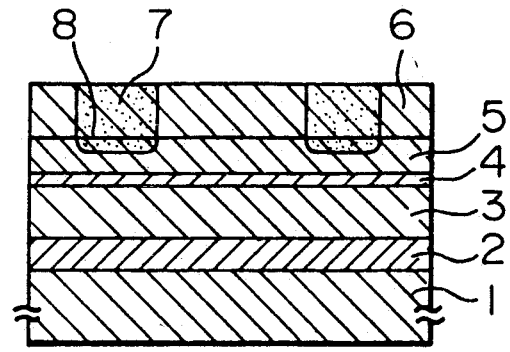
FIGS. 2A through 2D, FIGS. 4A through 4C, FIGS. 5A and 5B, FIGS. 6A and 6B, and FIGS. 7A and 7B are vertical sections each showing the steps of impurity doping in the photo-detection device according to the present invention.
Figure 2B:
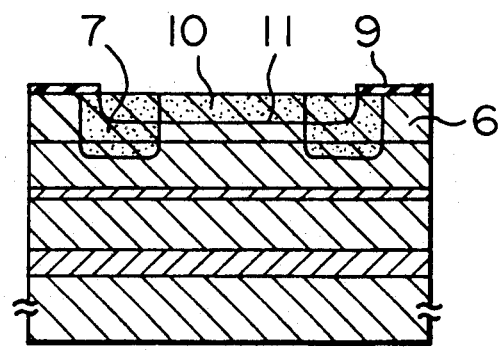
Figure 2C:
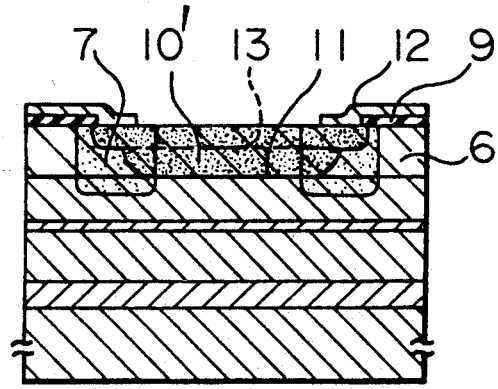
Figure 2D:
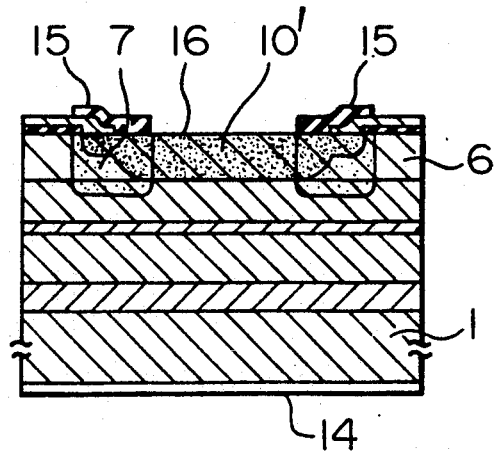

Referring to FIGS. 2A through 2D, Example 1 will be described below. FIGS. 2A through 2D are sections showing the steps of the producing process in order according to the present invention. In FIG. 2A, an $n^-$-InP buffer layer (1 $\mu$m thick) 2, an $n^-$-InGaAs light absorbing layer (2 $\mu$m thick) 3, an n-InGaAsP barrier height buffer layer (0.2 $\mu$m thick) 4, an n-InP electric-field buffer layer ($4 \times 10^{16}$ cm$^{-3}$, 0.8 $\mu$m thick) 5, and an $n^-$-InP window layer (1.8 $\mu$m thick) 6 were grown one after one by an epitaxial growth method on an n-InP substrate of the $n^+$ conduction type. In the above configuration, the $n^-$ layers were not smaller than $5 \times 10^{15}$ cm$^{-3}$. Next, Be was doped in the form of a ring having an outer diameter of 80 $\mu$m and an inner diameter of 50 $\mu$m by an ion implantation method from the outer surface of the window layer 6, and then subjected to heat treatment to thereby form a p-n junction having a depth of 2.1 $\mu$m. In FIG. 2A, the reference numeral 7 designates a p-type region formed by the Be doping, and 8 designates a p-n junction. The impurity concentration gradient was about $5 \times 10^{20}$ cm$^{-4}$ in the vicinity of the interface between the window layer 6 and the electric-field buffer layer 5. Next, as shown in FIG. 2B, an insulating film 9 was formed on the outer surface of the window layer 6 to cover the latter, a window having a diameter of 70 $\mu$m formed through the insulating film 9 so as to be concentric with the p-type region 7 due to Be, and then Zn was doped to a depth of 1.4 $\mu$m by thermal diffusion of Zn. In the drawing, the reference numeral 10 designates a p-type region formed by the Zn doping. The impurity concentration gradient of Zn at the front of the p-type region 10 was steep or step-like, that is, about $10^{22}$ cm$^{-4}$. By the Zn doping, a p-n junction was newly formed inside the inner circumference of the p-type region 7 formed by the Be doping. Next, as shown in FIG. 2C, an insulating layer 12 is formed on the respective outer surfaces of the window layer 6 region and the insulating layer 9 so as to cover both the outer surfaces, a window having a diameter of 60 $\mu$m was formed through the insulating layer 12 so as to be concentric with the p-type region 7 due to Be, and then Zn was doped again to a depth of 1.8 $\mu$m by a thermal diffusion method. In the drawing, a broken line 13 indicates the Zn-doping depth shown in FIG. 2B, and 10' designates a p-type region formed by the second time Zn doping. The Zn-doped p-type region has a depth of two steps in the Be-doped p-type region 7. The impurity concentration gradient of Zn was the same as the foregoing. Next, as shown in FIG. 2D, an n-type electrode 14 was formed on the back surface of the substrate 1 and a ring-like p-type electrode 15 was formed on the outer surface of the Be-doped p-type region 7 (which was superimposed on the Zn-doped p-type region 10') to thereby form a photo-detection device. A reverse voltage was applied across the electrodes 14 and 15 and light having a wave length of 1.3 μm was incident through a window portion (hereinafter referred to as "incident window") 16 to thereby examine the characteristics. AS a result, a photo current was generated at 25 V and a breakdown voltage was 70 V, the maximum gain was 45, and the GB product (gain-bandwidth product), which was a product of the gain and the cut-off frequency, was 65 GHz. The gain in the incident window preferably showed evenness of ±5%. On the other hand, in the method not according to the present invention, that is, in the case where the Zn diffusion was formed so as to be deep at a time, the breakdown voltage was low to 60 V while the photo current generation voltage was substantially the same as the foregoing, the gain was uneven so that it was 5 at the maximum in the central portion while it was 15 in the circumferential portion, and a defect due to edge breakdown was caused. As a result, it has been found that such an edge breakdown can be effectively prevented by the method according to the present invention.

EXAMPLE 2

Figure 3:
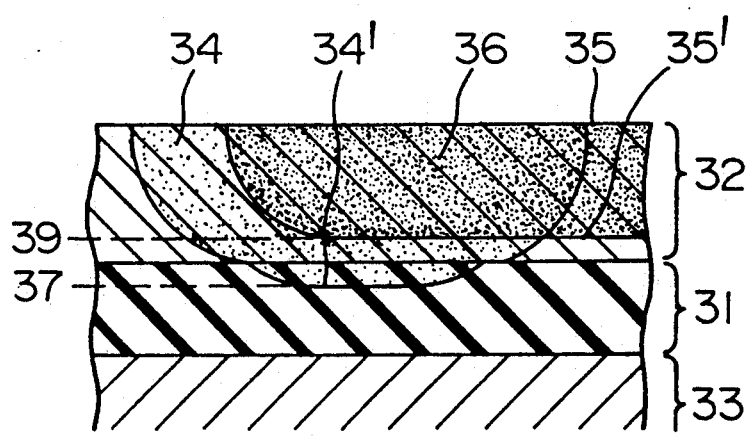
FIGS. 3, 8 and 9 are partial vertical sections each showing the shape of impurity-doped region in the conventional photo-detection device.

The characteristics of the photo-detection device according to the method of the present invention was compared in detail with that of the photo-detection device according to the conventional method. FIG. 1 shows an embodiment of the photo-detection device according to the present invention, and FIG. 3 shows an example of the conventional one. Each of FIGS. 1 and 3 is an enlarged section at a superimposing portion of the step-like distribution and gradational distribution of the concentration gradient of the doped impurity. Both the photo-detection devices were produced in the same manner as in Example 1 and the description of the producing methods therefor will be therefore omitted here. In FIG. 1, the reference numeral 21 designates an electric-field buffer layer, 22 designates a window layer, 23 designates a barrier buffer, a light absorbing layer, and so on. The reference numeral 24 designates a region of the p-type formed by the Be doping, 25 designates a region of the p-type formed by the Zn doping, and 26 designates a portion where the p-type regions 24 and 25 are superimposed on each other. The reference numerals 24' and 25' designate p-n junctions which are respective boundaries of the regions 24 and 25 located in portions where the regions 24 and 25 are not superimposed on each other. In the Zn-doped regions 25 and 26 the impurity concentration of Zn is high ($10^{20}$ cm$^{-3}$ order at portions other than the front portion) and the concentration gradient at the front portion is steep or step-like. In the Be-doped region 24, on the other hand, the impurity concentration of Be is about $10^{17}$ cm$^{-3}$ in the surface portion and the concentration gradient at the front portion is gradational. A broken line 27 shows the depth of the p-n junction formed by the Be doping at the deepest portion thereof, a broken line 28 shows the depth of the p-n junction formed by the Zn doping at the deepest portion thereof, and a broken line 29 indicates the depth of a portion in which Zn has been doped shallowly. In FIG. 3, on the other hand, the reference numerals 31 through 36, 34' and 35' correspond to the reference numerals 21 through 26, 24' and 25' in FIG. 1, and description about the parts designated by those reference numerals is omitted here. In FIG. 3, however, the p-type region formed by the Zn doping has a depth of a single step, and broken lines 39 and 37 show the depth of the Zn-doped region and the depth of the p-n junction formed by the Be doping at the deepest portion thereof. Comparison was made between the photodetection devices respectively having the structures as illustrated, and the results of comparison were as follows. That is, in the conventional configuration (FIG. 3), the condition to generate sufficient gain, that is, the condition to generate breakdown in the p-n junction 35', was that the distance from the electric-field buffer layer 31 to the junction 35' was 0.5 μm or more, and in the case where the above distance was smaller than 0.5 μm, edge breakdown was generated at a curved portion of the region 36 so that the device became defective. In the configuration according to the present invention, on the other hand, it was found that the condition to generate breakdown at the p-n junction 25' was that the distance from the electric-field buffer layer 21 to the junction 25' was 0.2 μm or more when the difference between the respective depths 28 and 29 of the Zn-doped regions was set to 0.1 μm. Further, it was found that in the case where the difference between the respective depths 28 and 29 of the Zn-doped regions was set to 0.4 μm, a preferable result was obtained even if the junction 25 entered the inside of the electric-field buffer layer 21 by 0.2 μm. As a result, it was found that in the configuration according to the present invention, the allowable range in producing photo-detection devices was wide. This is because the distance between the edge portion (curved portion) of the Zn-doped region where edge breakdown is easily generated and the p-n junction 24', that is, the distance between the depth 29 and 27 according to the present invention (FIG. 1) can be made larger than the distance between the depths 39 and 37 in the conventional case (FIG. 3) so that the range where the depletion layer can extend is so wide as to prevent breakdown at the edge portion. Next, comparison was made with respect to the GB product between the structures, according to the present invention and the conventional technique, in which a sufficient large gain could be obtained. As a result, the GB product was 45 GHz at the best in the conventional structure, while the structure according to the present invention showed particularly superior characteristics so that the GB product reached 80 GHz at the best. This concerns with the degree of the magnification region which is one of the restriction factors of the GB product. That is, the reason is in that in the conventional structure it is necessary to make the distance between the p-n junction 35' and the electricfield buffer layer 31 large so that the magnification region becomes large to thereby make the cut-off frequency low, while in the structure according to the present invention, since the p-n junction 25' can be incorporated into the electric-field buffer layer 21 in an extreme case, the magnification region can be made extremely small so that there is no lowering of the cut-off frequency. Thus, it has been found that the structure according to the present invention makes it possible to easily produce photo-detection devices having superior characteristics.

EXAMPLE 3

Figure 4A:
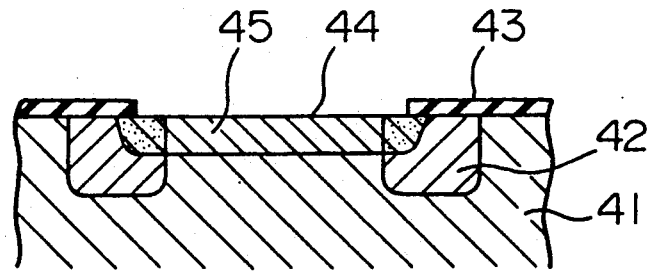
Figure 4B:
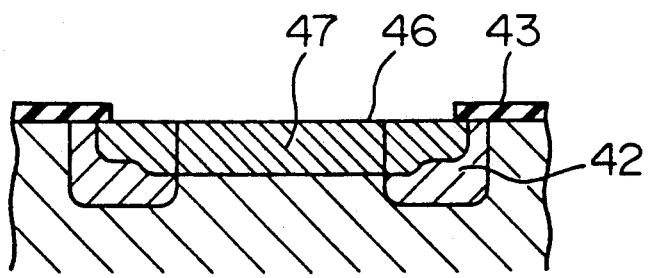
Figure 4C:
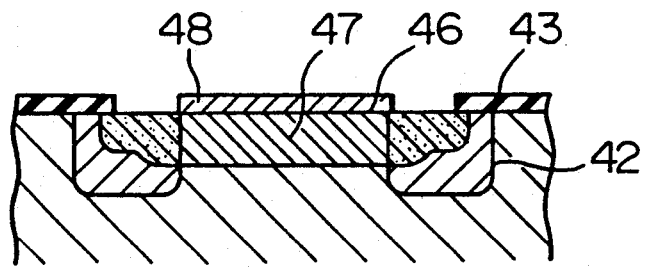

Various methods for forming steps in the Zn-doped regions were examined. First, the method of FIGS. 4A through 4C will be described. In FIG. 4A, a ring-like Be-doped p-type region 42 was formed in semiconductor crystal 41 (illustration of various layers including a window layer is omitted), an insulating film 43 was formed so as to cover the outer surface of the p-type region 42, and a window 44 was formed so as to be concentric with the p-type region 42. Zn was doped through the window 44 so as to form a Zn-doped p-type region 45. Then, as shown in FIG. 4B, the inner diameter of the insulating film 43 was enlarged to form a window 46, Zn was doped again through the window 46 to form the enlarged p-type region 47. As a result, a step could be formed in the Zn-doped region inside the Be-doped p-type region 42. The step was variable depending on the heating time and temperature at the second time Zn doping. Further, if circumstances require, a film 48 of SiNx or the like may be formed on the outer surface of the p-type region 47 to cover the latter and then heated to thereby generate p-type impurity emphasized diffusion so that the p-n junction formed by an ordinary thermal diffusion method is subjected to transformation. As a result, the continuity at the step portion becomes more smooth and evenness of the junction plane is eliminated. With respect to this process, the configuration and effects were disclosed, by a part of the inventors of this application, in the above-mentioned application Ser. No. 07/474336.

EXAMPLE 4

Figure 5A:
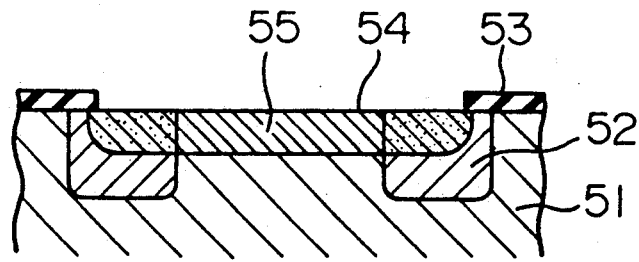
Figure 5B:
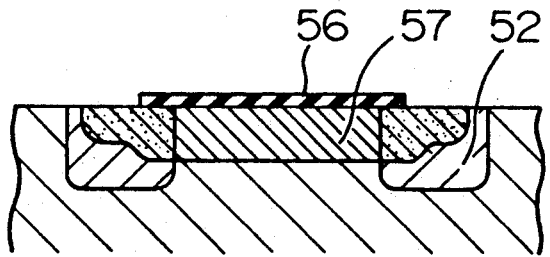

Next, the method of FIGS. 5A and 5B will be described. In FIG. 5A, a ring-like Be-doped p-type region 52 was formed in semiconductor crystal 51 (the detail is omitted), an insulating film 53 was formed so as to cover the outer surface of the p-type region 52, and a window 54 was formed so as to be concentric with the p-type region 52. Zn was doped through the window 54 so as to form a Zn-diffused p-type region 55. Then, as shown in FIG. 5B, an insulating film 56 was formed on the outer surface portion smaller in diameter than the Zn-doped region of FIG. 5A and then heated. As a result, under the insulating film 56, Zn was selectively diffused so that a region 57 was formed. As a result, the Zn-doped region inside the Be-doped p-type region 52 had two steps. The steps were variable depending on the time and temperature of the above-mentioned heating.

EXAMPLE 5

Figure 6A:
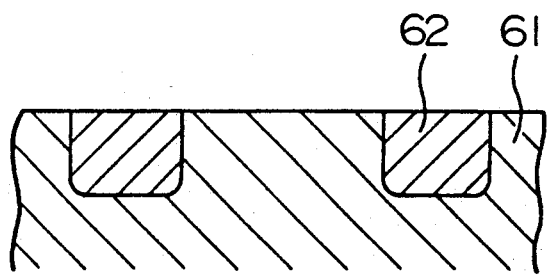
Figure 6B:
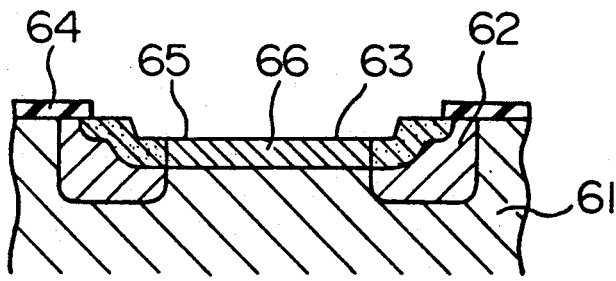

Next, the method of FIGS. 6A and 6B will be described. In FIG. 6A, a ring-like Be-doped p-type region 62 was formed in semiconductor crystal 61 (the detail is omitted). Then, as shown in FIG. 6B, a recess 63 was formed in the outer surface of the semiconductor crystal 61 by selective etching. The shape of the recess 63 was made to be concentric with the p-type region 62 and to have a diameter which was larger than the inner diameter of the p-type region 62 but smaller than the outer diameter of the same. Further, an insulating film 64 was formed to cover the outer surface of the semiconductor crystal 61 and the p-type region 62, and a window 65 was formed so as to have a diameter larger than diameter of the recess 63 but smaller than the outer diameter of the p-type region 62. Zn was doped through the window 65 so as to form a p-type region 66. The step of the Zn-doped region 66 was formed inside the p-type region 62 depending on the depth of the recess 63. It is possible to adjust the step of the Zn-doped region 66 by a combination of the foregoing methods.

Figure 7A:
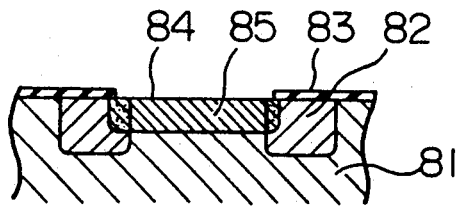
Figure 7B:
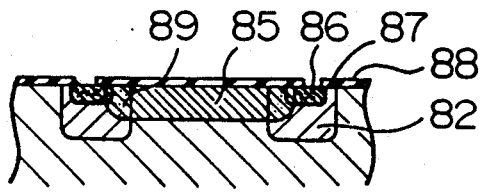
Figure 8:
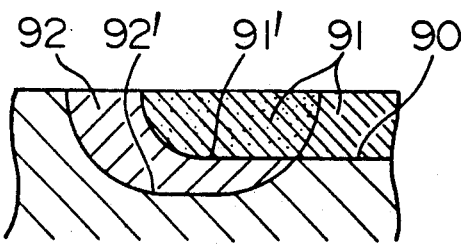
Figure 9:
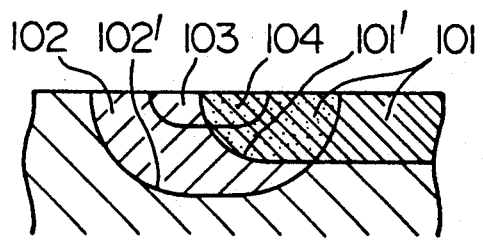

FIGS. 7A and 7B show a comparative example in which a step was formed with different impurities. In FIG. 7A, the reference numeral 81 designates semiconductor crystal, 82 designates a Be-doped low concentration region having a gradational distribution, and 85 designates a Zn-doped high concentration region having a step-like distribution. The region 85 was formed by Zn diffusion through a window 84 formed in an insulating film 83 which was formed on the outer surface of the semiconductor crystal 81. Next, as shown in FIG. 7B, an insulating film 83 was formed again and a ring-like window 86 was formed in the vicinity of the circumference of the region 85, and Cd was doped by diffusion to thereby form a high concentration region 87. An edge portion 89 of the crystal and region 85 was left as it had a small radius of curvature and electric-field concentration could not be prevented. From the foregoing, in order to make the shape of the step portion smooth, it is more preferable to use the method according to the present invention in which the step is formed with the same impurity.

EXAMPLE 6

The same structure as that in each of the Example 1 through 5 was examined by using impurities of Cd, Mg, B and so on. As a result, it was found that the same structure could be obtained if the impurity concentration distributions were relatively made such that one was a high concentration step-like distribution, while the other was a low concentration gradational distribution, and found that various impurities could be used. Further, it was found that two or more kinds of impurities might be doped in one region.

EXAMPLE 7

Examined was a case where a region having a high concentration and a step-like distribution was formed so as to have multi-steps. In order to form multi-steps, for example, it will do to perform diffusion three times or more while enlarging the Zn-diffusing window in FIG. 4. This applies to the other methods. As a result, the effect to prevent edge breakdown was good similarly to the foregoing, while the complexity of the producing process could not be avoided.

EXAMPLE 8

In this example, the position of the step portion of the Zn-doped region was examined, while description has been made at to the cases where the step portion of the Zn-doped region was inside the Be-doped region (guardring portion) in the foregoing examples.

Figure 10:
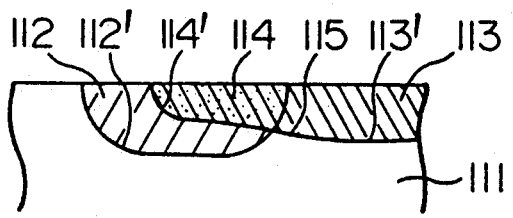

Referring to FIG. 10, description is made. In the drawing, the reference numeral 111 designates semiconductor crystal (the detail is omitted), 112 designates a Be-doped region, 112' designates a p-n junction of the region 112, 113 designates a Zn-doped region, 113' designates a p-n junction of the region 113, 114 designates a portion where the Zn-doped and Be-doped region are superimposed on each other, 114' designates a shallow and curved Zn-doped region, and 115 designates a step portion of the Zn-doped region. This structure has a feature in that the depth of the Zn-doped region 114 varies in the inside of the Be-doped region 112, while the step portion 115 of the Zn-doped region is in the outside of the Be-doped region 112.

Also in this example, since the Zn curved portion 114' having a small radius of curvature is formed at a shallow position, there is a preferable effect that edge breakdown can be prevented by the same operation as in Example 2, and a photo-detection device having a good characteristic can be produced easily.

According to the present invention, since the extent of a depletion layer in a impurity-doped region having a low impurity concentration and a gradational distribution can be widened, it is possible to widen the allowable range in which edge breakdown of the photodetection device can be prevented on one hand, and since the width of a magnification region of a p-n junction within a light incident window can be made small, photo-detection devices high in cut-off frequency can be produced with good yield.

As materials for the crystal, other than semiconductors of a GaAs group, a InAs group, a AlAs group, a GaSb group, and a AlSb group, semiconductors of Ge, Si, etc. may be used. With respect to the impurities, it is a matter of course that II-family elements other than Be may be used, and III-VI family elements may be used depending on the kind and conduction type of a crystal base material. Although the case of a single impurity-doped region having a low concentration and a gradational distribution have been shown in the foregoing Examples, it is a matter of course that the present invention is applicable to the case where the impurity-doped region is composed of multistages or a plurality of sub-regions.

We claim:

1. A method for producing a semiconductor photo-detection device provided with a first impurity-doped region having a relatively high concentration and a step-like distribution for forming a light absorbing area in a semiconductor, and a second impurity-doped region forming a guardring and surrounding said first impurity-doped region while partly superimposing on said first impurity-doped region, in which said first impurity-doped region is formed by performing at least two times a step of forming an impurity-doped region so that said first impurity-doped region has a depth which is arranged so as to continuously vary in said second impurity-doped region.

2. A method for producing a semiconductor photo-detection device according to claim 1, in which the depth of said first impurity-doped region is made shallow in a circumferential portion of said first impurity-doped.

3. A method for producing a semiconductor photo-detection device according to claim 2, in which said method comprises a step of forming a film at a central portion of said first impurity-doped region and heating the same after said first impurity-doped region has been formed by performing at least two times said impurity-doped region forming step.

4. A method for producing a semiconductor photo-detection device provided with a first impurity-doped region having a relatively high concentration and a step-like distribution for forming a light absorbing area in a semiconductor, and a second impurity-doped region forming a guardring and surrounding said first impurity-doped region while partly superimposing on said first impurity-doped region, comprising: a step of forming, by impurity doping, said second impurity-doped region having a relatively low concentration and a gradational distribution; a step of performing working on said crystal so as make a surface of said crystal uneven; and a step of forming said first impurity-doped region having a relatively high concentration and a step-like distribution.

5. A method for producing a semiconductor photo-detection device according to claim 4, in which the depth of said first impurity-doped region is made shallow in a circumferential portion of said first impurity-doped.

6. A method for producing a semiconductor photo-detection device according to claim 5, further comprising a step of forming a film at least at a central portion of said first impurity-doped region and heating the same after execution of said step of forming said first impurity-doped region having a relatively high concentration and a step-like distribution.

7. A method for producing a semiconductor photo-detection device provided with a first impurity-doped region having a relatively high concentration and a step-like distribution for forming a light absorbing area in a semiconductor, and a second impurity-doped region forming a guardring and surrounding said first impurity-doped region while partly superimposing on said first impurity-doped region, in which after formation of said first impurity-doped region, a film is formed at least a part of a surface of said first impurity-doped region and heated so that said first impurity-doped region is arranged so as to have at least two depths which are different from each other but continuous to each other.

8. A method for producing a semiconductor photo-detection device according to claim 7, in which the depth of said first impurity-doped region is made shallow in a circumferential portion of said first impurity-doped region.

9. A method for producing a semiconductor photo-detection device according to claim 8, in which said method comprises a step of forming a film at a central portion of said first impurity-doped region and heating the same after formation of said first impurity-doped region.

* * * * *